(12) United States Patent
Kleeman et al.

(10) Patent No.: US 9,837,609 B2
(45) Date of Patent: *Dec. 5, 2017

(54) METHOD FOR MANUFACTURING AN ORGANIC ELECTRONIC DEVICE AND ORGANIC ELECTRONIC DEVICE

(71) Applicants: NOVALED GMBH, Dresden (DE); TECHNISCHE UNIVERSITÄT DRESDEN, Dresden (DE)

(72) Inventors: Hans Kleeman, Dresden (DE); Alexander Zakhidov, Dresden (DE); Bjoern Luessem, Dresden (DE); Karl Leo, Dresden (DE)

(73) Assignee: NOVALED GMBH, Dresden (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/779,202

(22) PCT Filed: Mar. 25, 2014

(86) PCT No.: PCT/EP2014/055976
§ 371 (c)(1),
(2) Date: Sep. 22, 2015

(87) PCT Pub. No.: WO2014/154699
PCT Pub. Date: Oct. 2, 2014

(65) Prior Publication Data
US 2016/0064671 A1    Mar. 3, 2016

(30) Foreign Application Priority Data

Mar. 26, 2013 (EP) .................................... 13161158

(51) Int. Cl.
*H01L 51/00* (2006.01)
*H01L 51/10* (2006.01)
(Continued)

(52) U.S. Cl.
CPC ...... *H01L 51/0018* (2013.01); *H01L 51/0015* (2013.01); *H01L 51/0023* (2013.01);
(Continued)

(58) Field of Classification Search
CPC ............. H01L 51/0545; H01L 51/0036; H01L 51/0541; H01L 51/5012
See application file for complete search history.

(56) References Cited

U.S. PATENT DOCUMENTS 7,326,653 B2    2/2008  Gunner et al.
8,008,115 B2    8/2011  Katsuhara et al.
(Continued)

FOREIGN PATENT DOCUMENTS

EP         2 202 787 A1    6/2010

OTHER PUBLICATIONS

PCT International Search Report for PCT Application No. PCT/Ep2014/055976 dated Jun. 11, 2014 (3 pages).
(Continued)

*Primary Examiner* — Quoc Hoang
(74) *Attorney, Agent, or Firm* — Eversheds Sutherland (US) LLP

(57) ABSTRACT

The disclosure provides a method of manufacturing an organic electronic device, including providing a layered device structure, the layered device structure including a plurality of electrodes and an electronically active region, said providing of the layered device structure including steps of providing an organic semiconducting layer, applying a structuring layer to the organic semiconducting layer, the structuring layer having a first region and a second region, the first region being covered by a layer material, applying a contact improving layer to the structuring layer by depositing at least one of an organic dopant material and an organic dopant-matrix material at least in the first region,
(Continued)

Figure 1:
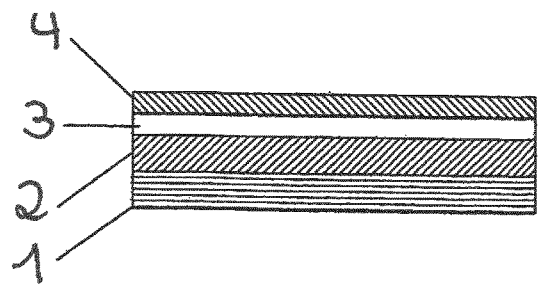
Figure 1:
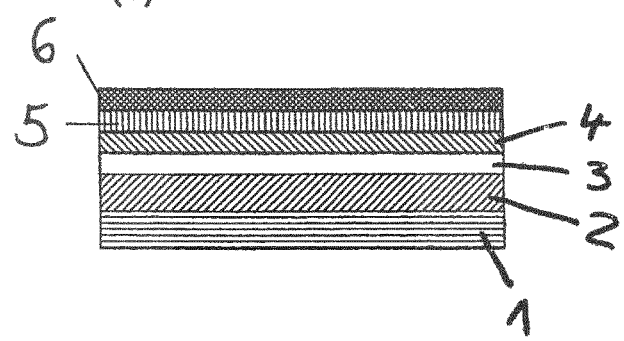
Figure 1:
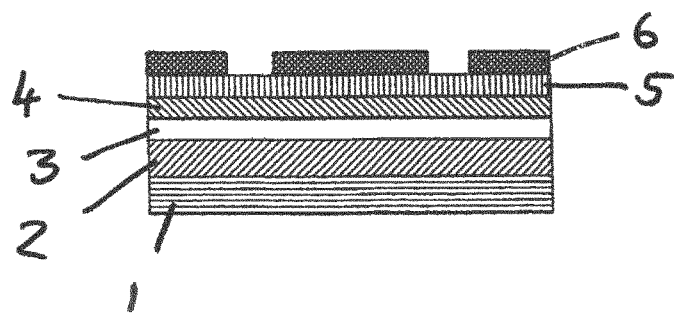
Figure 1:
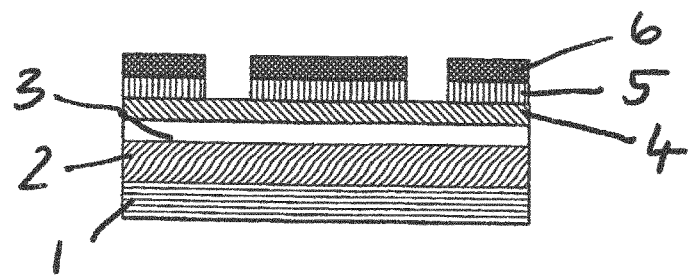
Figure 1:
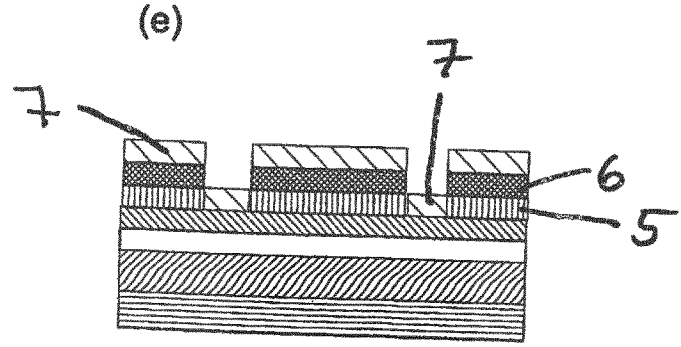
Figure 1:
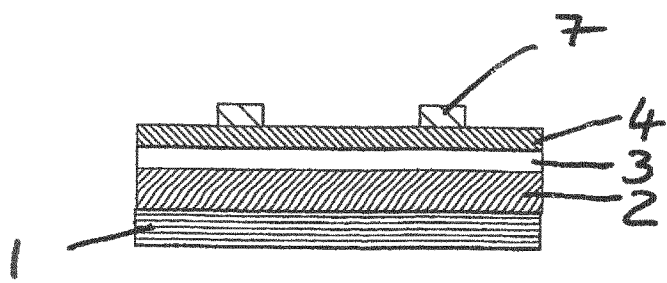

depositing a layer material on the contact improving layer at least in the first region, and removing the structuring layer at least in the second region. Furthermore, an organic electronic device is provided.

11 Claims, 16 Drawing Sheets

(51) Int. Cl.
*H01L 51/44* (2006.01)
*H01L 51/56* (2006.01)
*H01L 51/05* (2006.01)

(52) U.S. Cl.
CPC ............ *H01L 51/102* (2013.01); *H01L 51/44* (2013.01); *H01L 51/56* (2013.01); *H01L 51/0016* (2013.01); *H01L 51/0512* (2013.01); *Y02E 10/549* (2013.01); *Y02P 70/521* (2015.11)

(56) References Cited

U.S. PATENT DOCUMENTS

| | | | |
|---|---|---|---|
| 8,298,839 | B2 | 10/2012 | Kasahara |
| 8,802,491 | B2 | 8/2014 | Katsuhara |
| 2007/0148813 | A1 | 6/2007 | Masuda |
| 2010/0219402 | A1 | 9/2010 | Katsuhara et al. |
| 2011/0297920 | A1 | 12/2011 | Fukuda |
| 2016/0049605 | A1* | 2/2016 | Guenther ............ H01L 51/0001 257/40 |

OTHER PUBLICATIONS

Fujimori et al., "Variation of Conductivity and Activation Energy in Metal-Doped and Undoped C60 Films under Oxygen Exposure," Solid State Communications, 1994, 89(5):437-440.

He et al., "High-Efficiency and Low Voltage p-i-n Electrophosphorescent Organic Light-Emitting Diodes with Double Emission Layers," Applied Physics Letters, 2004, 85(17):3911-3913.

Huang et al., "Patterning of Organic Devices by Interlayer Lithography," J. Mater. Chem., 2007, 17:1043-1049.

Kobayashi et al., "C60 Thin-Film Transistors with High Field-Effect Mobility, Fabricated by Molecular Beam Deposition," Science and Technology of Advanced Materials, 2003, 4:371-375.

Matsushima et al., "Estimation of Electron Traps in Carbon-60 Field-Effect Transistors Thermally Stimulated Current Technique," Applied Physics Letters, 2007, 91(10):103505.

Necliudov et al., "Contact Resistance Extraction in Pentacene Thin Film Transistors," Solid-State Electronics, 2003, 47:259-262.

Rothschild et al., "Fluorine—An Enabler in Advanced Photolithography," Journal of Fluorine Chemistry, 2003, 122:3-10.

Virkar et al., "The Role of OTS Density on Pentacene and C60 Nucleation, Thin Film Growth, and Transistor Performance," Advanced Functional Materials, 2009, 19:1962-1970.

Zhang et al., "High-Performance C60 n-Channel Organic Field-Effect Transistors Through Optimization of Interfaces," Journal of Applied Physics, 2008, 104:104504-1-104504-6.

Zhang et al., "Low-Voltage C60 Organic Field-Effect Transistors with High Mobility and Low Contact Resistance," Applied Physics Letters, 2008, 93:133305-1-133305-3.

Chinese Office Action for CN Application No. 201480018607.0 dated Mar. 29, 2017 (11 pages) (English translation).

* cited by examiner (d)

(e)

(f)

(a)

(b)

(c)

(d)

(e) 76

(f)

(g)

(h) 77

1

METHOD FOR MANUFACTURING AN ORGANIC ELECTRONIC DEVICE AND ORGANIC ELECTRONIC DEVICE

CROSS REFERENCE TO RELATED APPLICATIONS

The application is a U.S. national stage application of PCT/EP2014/055976, filed Mar. 25, 2014, which claims priority to European Application No. 13161158.4, filed Mar. 26, 2013. The contents of these applications are hereby incorporated by reference.

The invention refers to a method of manufacturing an organic electronic device and an organic electronic device.

BACKGROUND

The compatibility of organic materials and device concepts to high resolution, cost-effective patterning techniques exhibits a major requirement in order to warrant their commercial success. In particular, down-scaling and high density integration of organic field effect transistors (OT-FTs) is essential to overcome current performance limitations and to make OTFTs become a prospective device for applications e.g. in active matrix displays or organic microprocessors.

With respect to the production of organic electronic devices having an electronically active region which is being made at least in part from an organic material and which is in contact with one or more electrodes. Various methods for structuring the organic semiconductor layers were proposed, e.g. shadow mask deposition, laser ablation, inkjet printing, or nano-imprinting. However, they are either lacking in their throughput capacitance, accessible feature size, or their compatibility with the organic compounds themselves. Photolithography on the other hand is a very powerful technique which is currently adopted as a standard patterning approach for inorganic electronic industry. However, except of some limited cases (cf. Balocco et al., Org. Electron. 7, 500 (2006), Huang et al., J. Mat. Chem. 17, 1043 (2007)), conventional photo-resist, developer, and solvent compounds (using e.g. tuluol and alkaline solvents) are not applicable to organic materials.

SUMMARY

It is an object of the invention to provide technologies for organic electronic devices having an improved operation functionality.

According to one aspect, a method of manufacturing an organic electronic device is provided, the method comprising providing a layered device structure, the layered device structure comprising a plurality of electrodes and an electronically active region being provided in electrical contact with at least one of the plurality of electrodes, said providing of the layered device structure comprising steps of providing an organic semiconducting layer, applying a structuring layer to the organic semiconducting layer, the structuring layer having a first region and a second region, the first region being covered by a layer material, applying a contact improving layer to the structuring layer by depositing at least one of an organic dopant material and an organic dopant-matrix material at least in the first region, depositing a layer material on the contact improving layer at least in the first region, and removing the structuring layer at least in the second region. According to another aspect, an organic electronic device is provided, the device comprising a layered device structure, the layered device structure comprising a plurality of electrodes and an electronically active region being provided in electrical contact with at least one of the plurality of electrodes, in the layered structure, an organic semiconducting layer comprising a first region treated in a photo lithography process, and a layer stack deposited on the first region, the layer stack comprising a structured layer and a contact improving layer provided between and in contact with the first region and the structured layer.

A method of manufacturing an organic electronic device is provided, the method comprising providing a layered device structure, the layered device structure comprising a plurality of electrodes and an electronically active region being provided in electrical contact with at least one of the plurality of electrodes. The step of providing the layered device structure comprises a step of providing an organic semiconducting layer steps of applying a structuring layer on the organic semiconducting layer, the structuring layer being provided with a first region to be covered by the layer material and a second region not to be covered by the layer material, applying a contact improving layer on the structuring layer by depositing an organic dopant material and/or an organic dopant-matrix material at least in the first region, depositing a layer material on the contact improving layer at least in the first region, and removing the structuring layer at least in the second region, but not in the first region.

According to another aspect, an organic electronic device is provided, the device comprising
  a layered device structure, the layered device structure comprising a plurality of electrodes and an electronically active region being provided in electrical contact with at least one of the plurality of electrodes,
  in the layered structure, an organic semiconducting layer comprising a first region treated in a photo lithography process, and
  a layer stack deposited on the first region, the layer stack comprising a structured layer and a contact improving layer provided between and in contact with the first region and the structured layer.

After the step of removing the structuring layer the layer material with the underlying contact improving layer remains at least in the first region, thereby, providing coverage of at least the first region, but not the second region, with the layer material.

By the contact improving layer, an electrical contact may be improved at an interface between the organic semiconducting layer and the structured layer produced above the organic semiconducting layer in the layered structure.

The structuring process may be used several times in the process of producing the layered device structure.

The electronically active region, besides the contact improving layer, may comprise one or more organic layers made of at least one organic semiconducting material, preferably an organic small molecule semiconductor different from organic polymers.

The contact improving layer may be provided in between and in contact with layers both made of an electrically non-doped material. The contact improving layer may improve the electrical contact at the interface of the two non-doped layers.

The organic semiconducting layer and/or the contact improving layer may be provided either by vacuum deposition or by a solution-based deposition process.

By the process comprising said applying the structuring layer on the organic semiconducting layer, said applying the contact improving layer on the structuring layer, said depositing the layer material on the contact improving layer, and said removing the structuring layer at least in the second region, a structured layer made of a layer material is provided on the organic semiconducting layer.

The method may further comprise a lift-off structuring process. The lift-off structuring process may be used several times in the process of producing the layered device structure. The lift-off structuring process may comprise the steps of applying the structuring layer on the organic semiconducting layer, applying the contact improving layer on the structuring layer, depositing the layer material on the contact improving layer, and removing (lifting-off) the structuring layer at least in the second region.

The step of providing the structuring layer may further comprise a step of using a photo lithographic process.

The using the photo lithographic process may further comprise steps of depositing a photo resist cover on the organic semiconducting layer and structuring the photo resist cover, said structuring comprising steps of illuminating and removing the photo resist cover, thereby, at least partially removing the photo resist cover in at least the second region, but not the first region. The photo resist cover may be removed by etching. The photo resist cover may be a single layer or a multi-layer cover. For example, a plurality of layers made from different photo resist materials may be provided. Different layers may be provided for implementing different functions in the lift-off structuring process.

The step depositing the photo resist cover may further comprise steps of depositing a protection layer on the organic semiconducting layer, and depositing a photo resist layer on the protection layer. The protection layer may provide protection for the underlying layer against wet materials used, for example, for the structuring of the photo resist layer, e.g. by etching. The protection layer may be transparent to oxygen. The step of structuring the photo resist cover may comprise removing at least the photo resist layer in at least the first region, but not the second region. In addition, the protection layer may at least partially be removed.

The etching of the photo resist cover may further comprise a step of providing a non-closed residual layer made from non-removed residuals of the photo resist cover in the first region. The non-removed residuals may be made of the material of the protection layer and/or photo resist layer. It may only partially cover the underlying organic semiconducting layer.

There may be a step of providing a structured electrode layer made of an electrode material. For example, one or more top electrodes may be produced, the top electrode(s) being provided on top of the electronically active region. Said providing of the structured electrode layer may part of the process of providing the structured layer.

There may further be a step of providing a structured non-electrode layer made of a non-electrode material. Said providing of the structured non-electrode layer may part of the process of providing the structured layer.

The photo lithographic process may be performed by using a fluorine based photo lithography.

The contact improving layer may be provided with a layer thickness of about 1 nm to about 100 nm.

The providing the layered device structure may comprise a step of providing a device selected from the following group: organic field effect transistor, an organic circuit assembly, organic light emitting device, and organic photovoltaic device.

DESCRIPTION OF PREFERRED EMBODIMENTS

Figure 2:
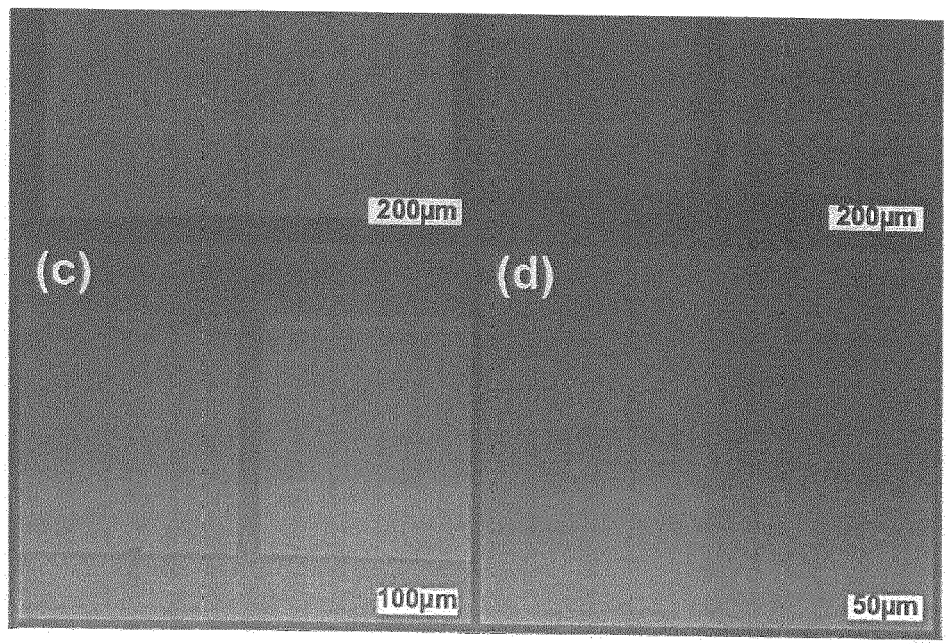
Figure 3:
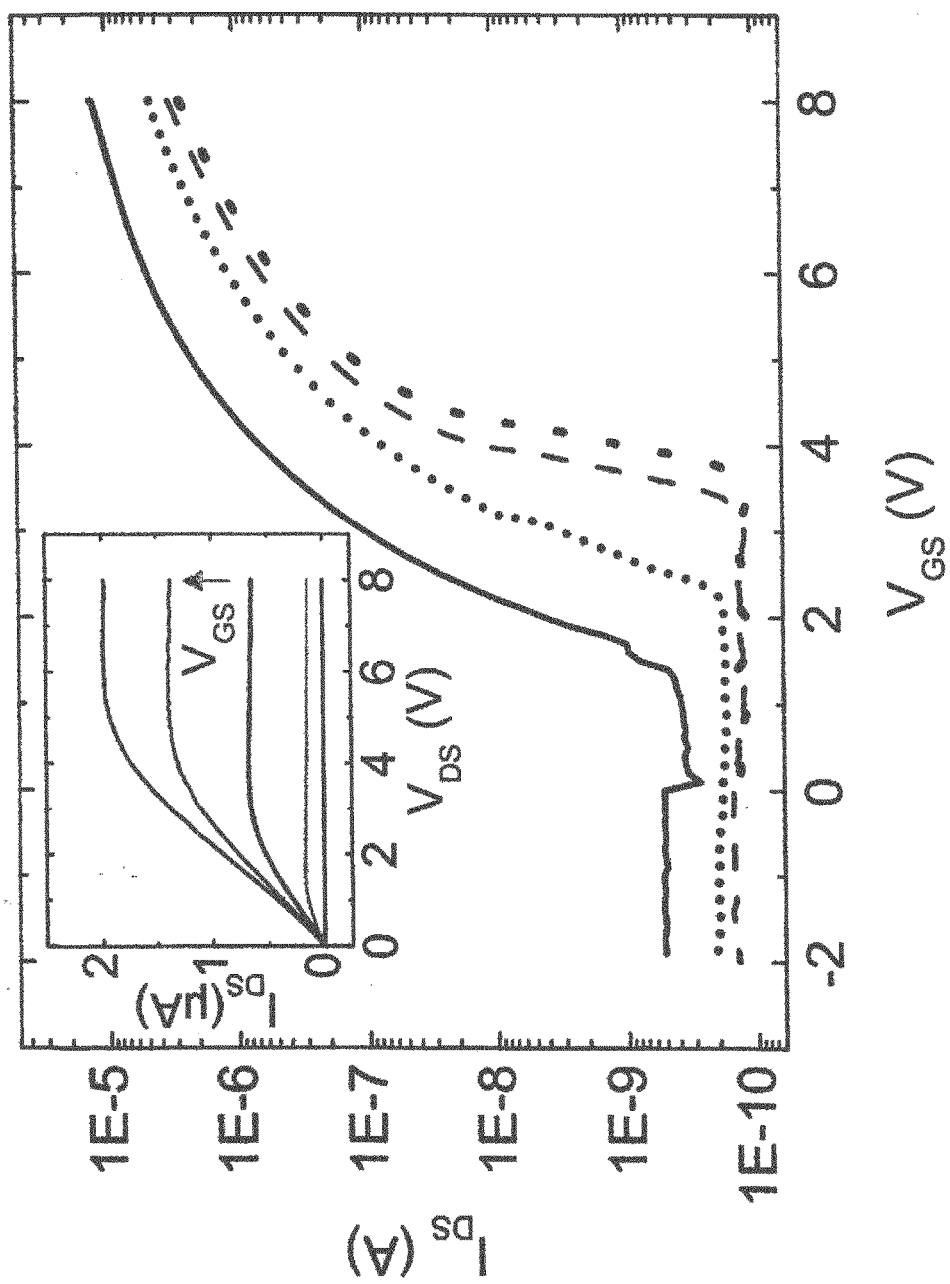
Figure 4:
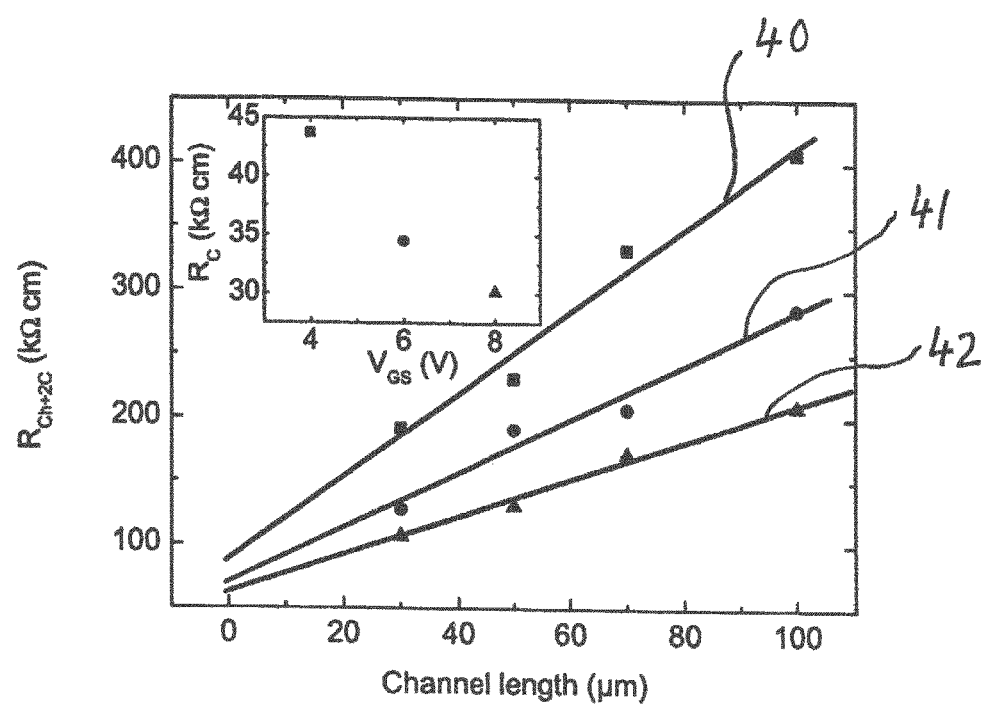
Figure 5:
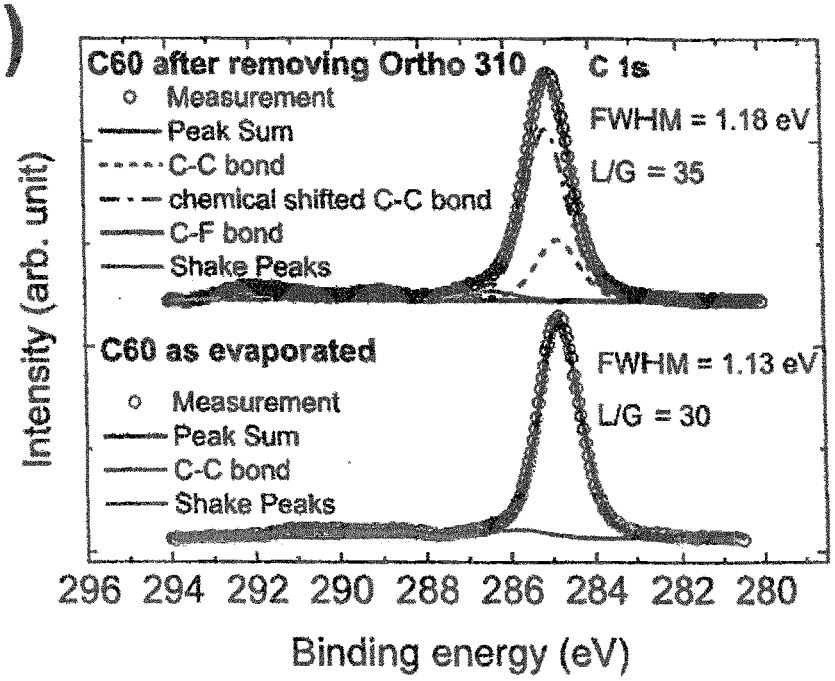
Figure 5:
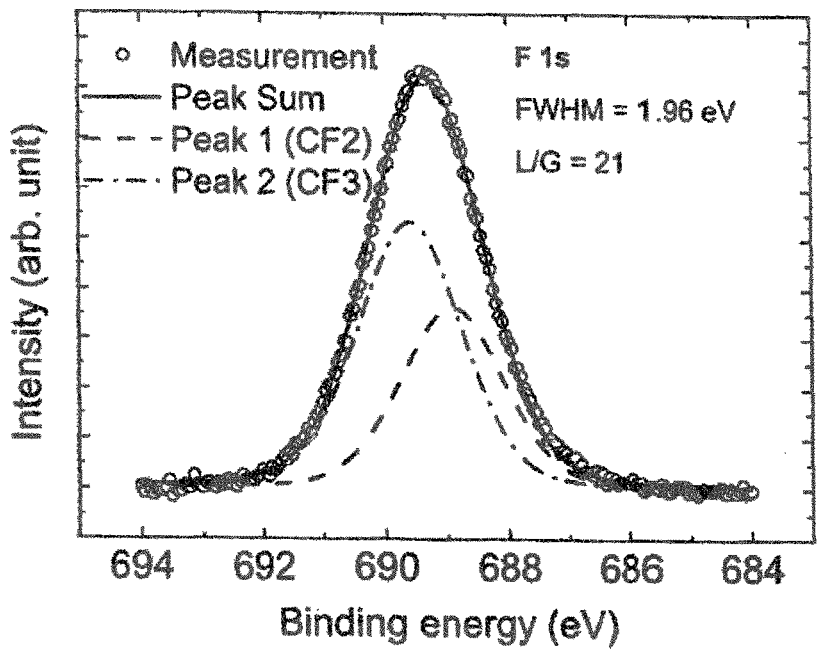
Figure 6:
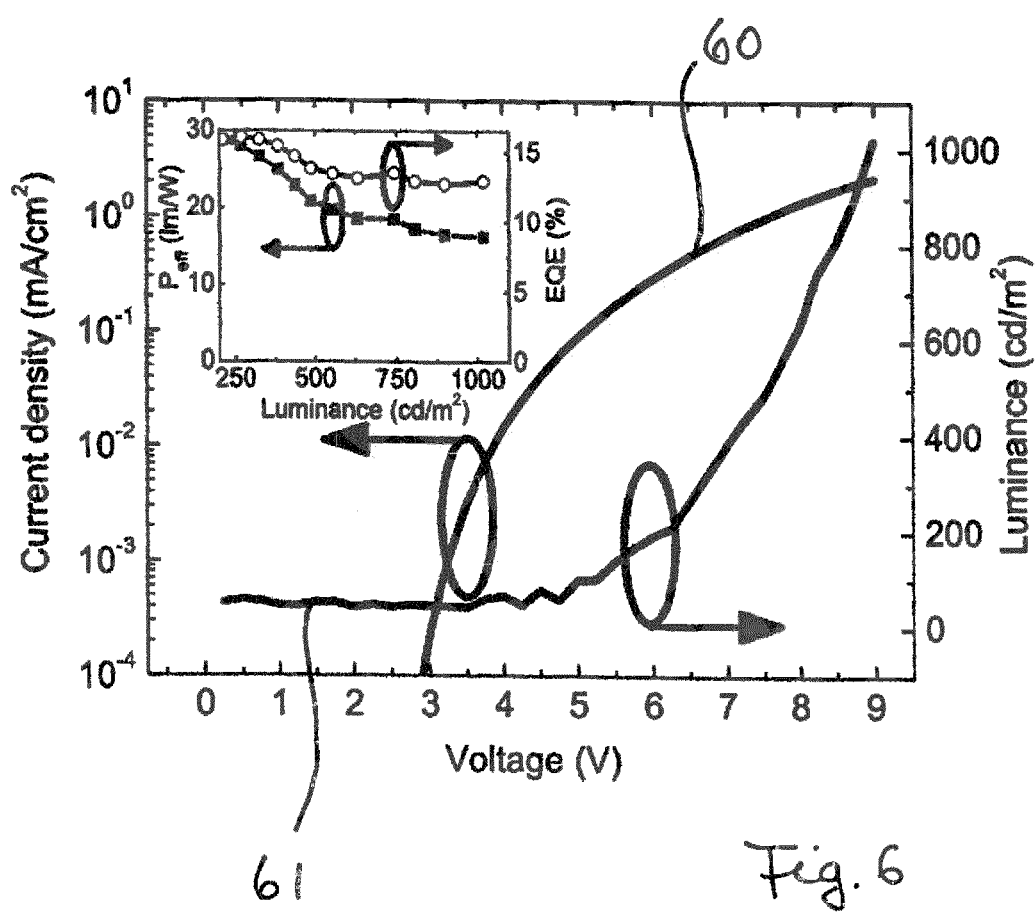
Figure 7:
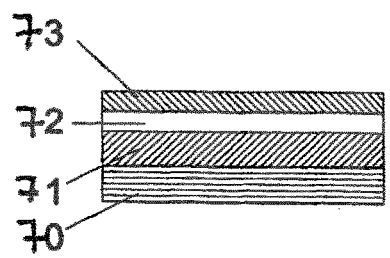
Figure 7:
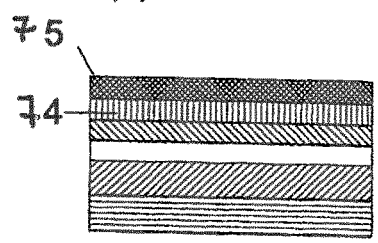
Figure 7:
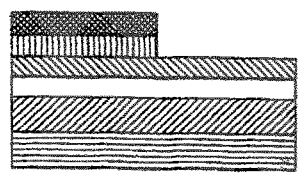
Figure 7:
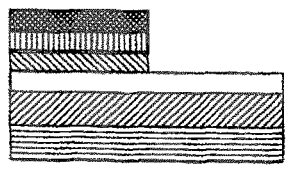
Figure 7:
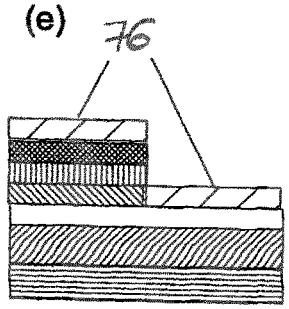
Figure 7:
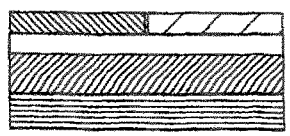
Figure 7:
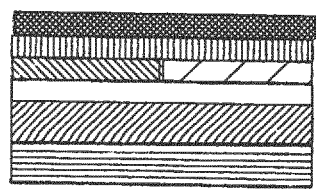
Figure 7:
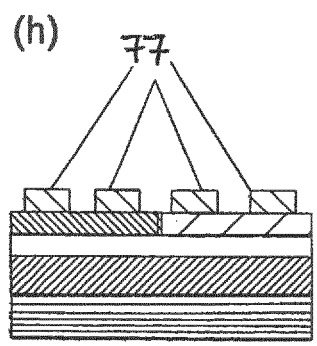
Figure 8:
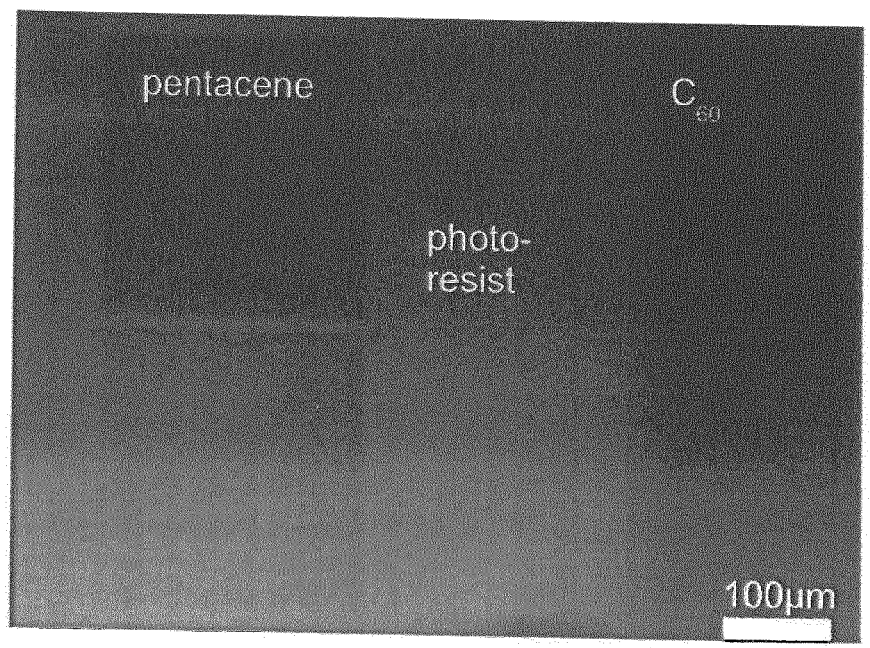
Figure 9:
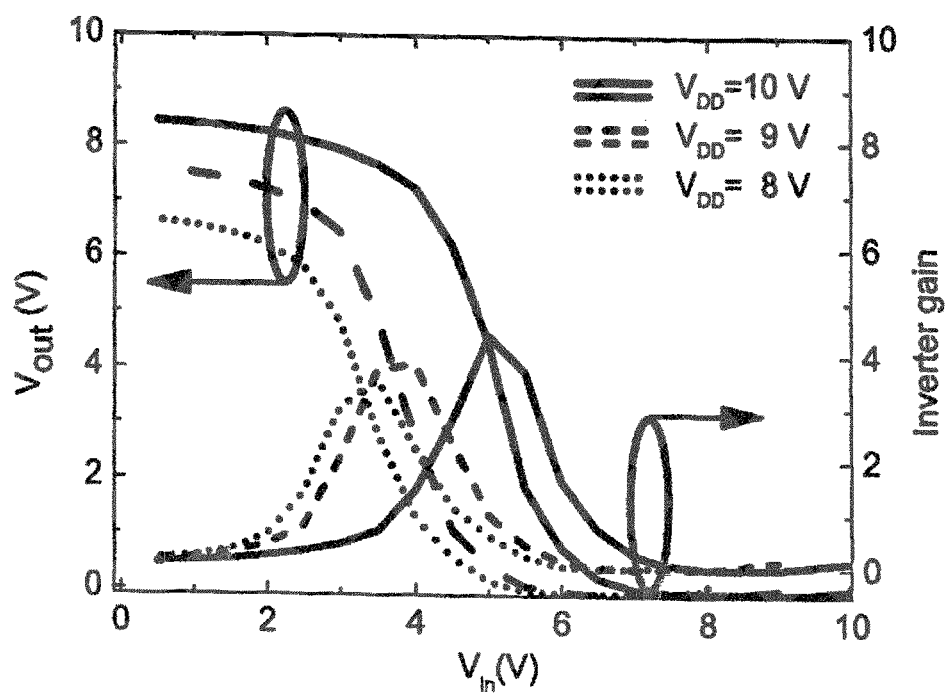
Figure 10:
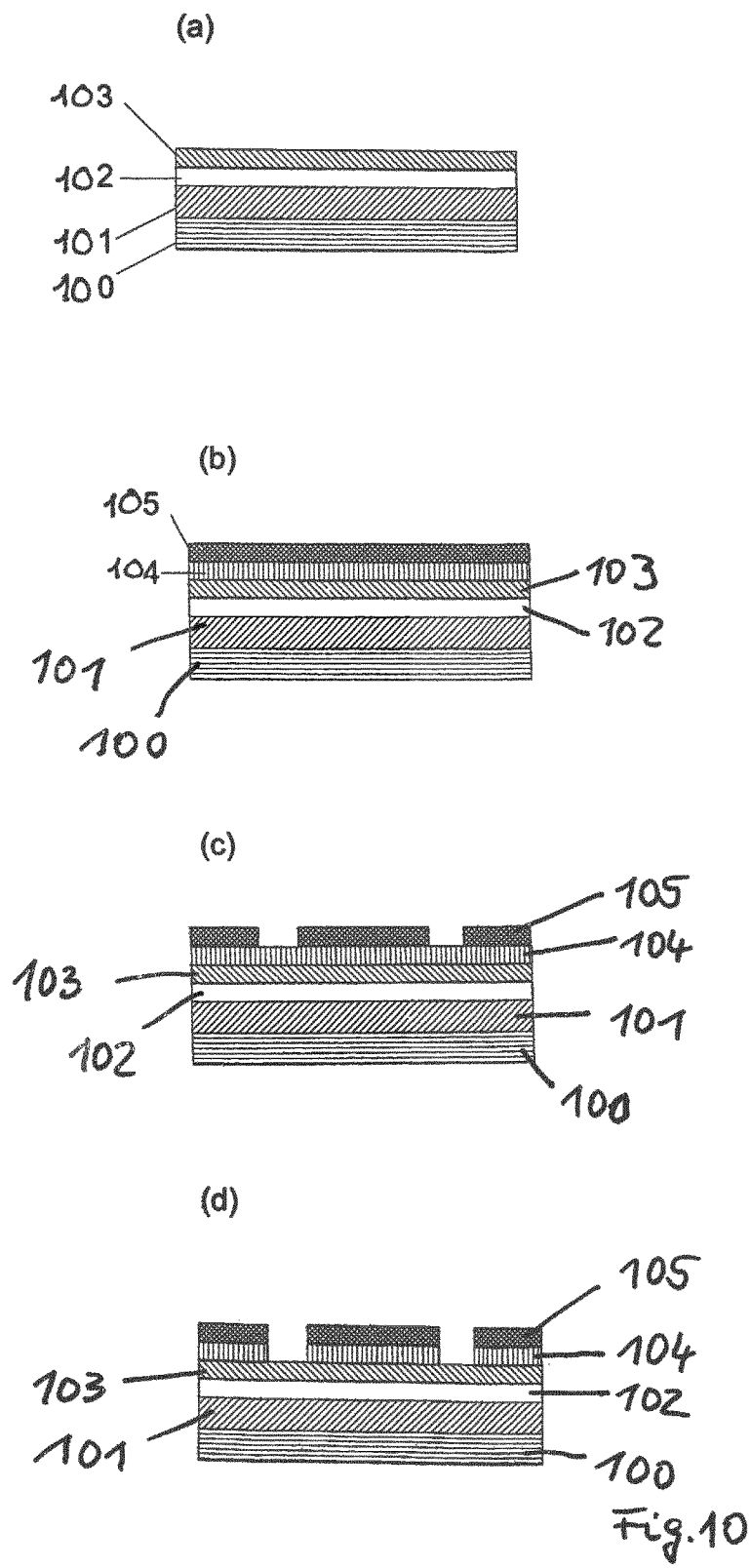
Figure 10:
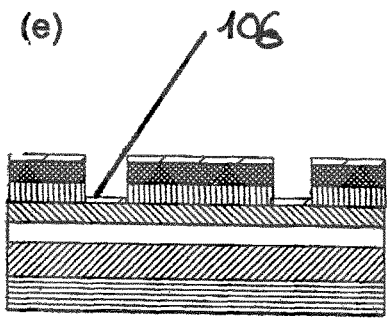
Figure 10:
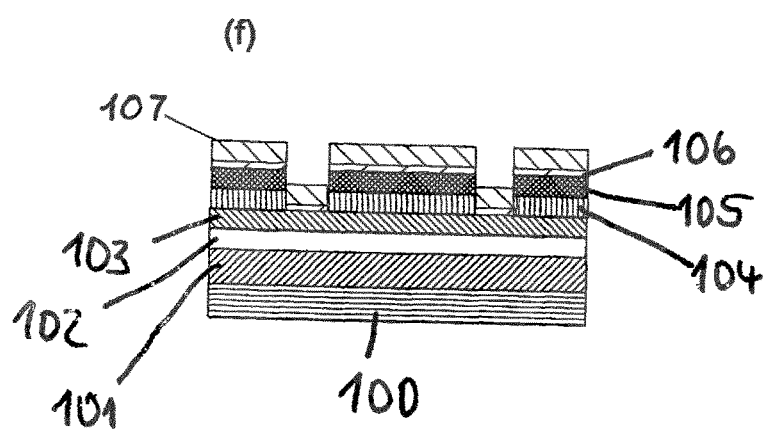
Figure 10:
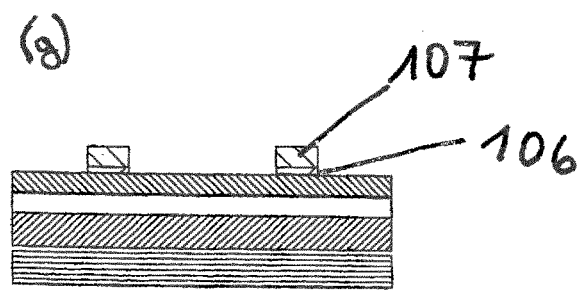
Figure 11:
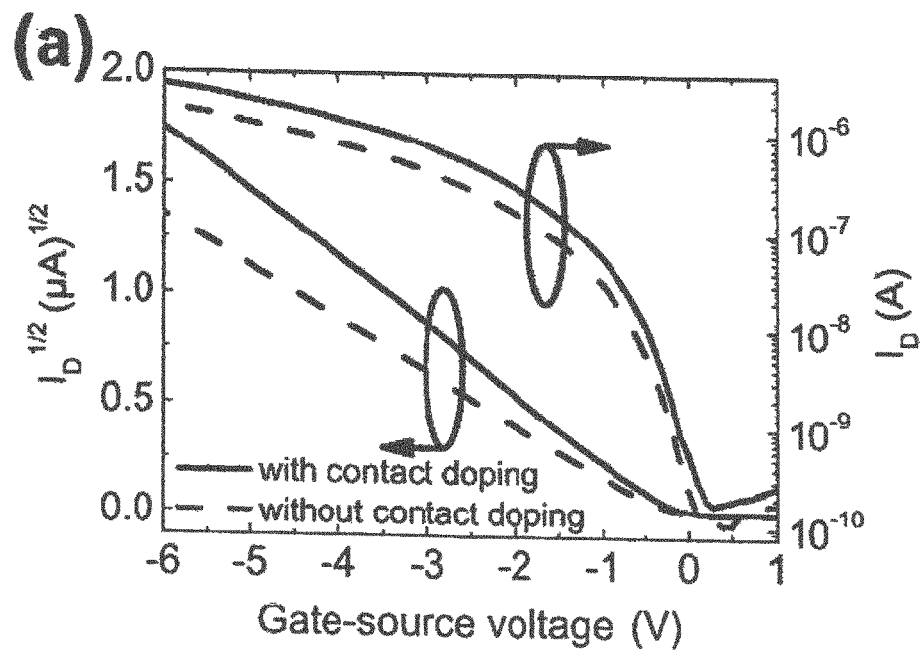
Figure 11:
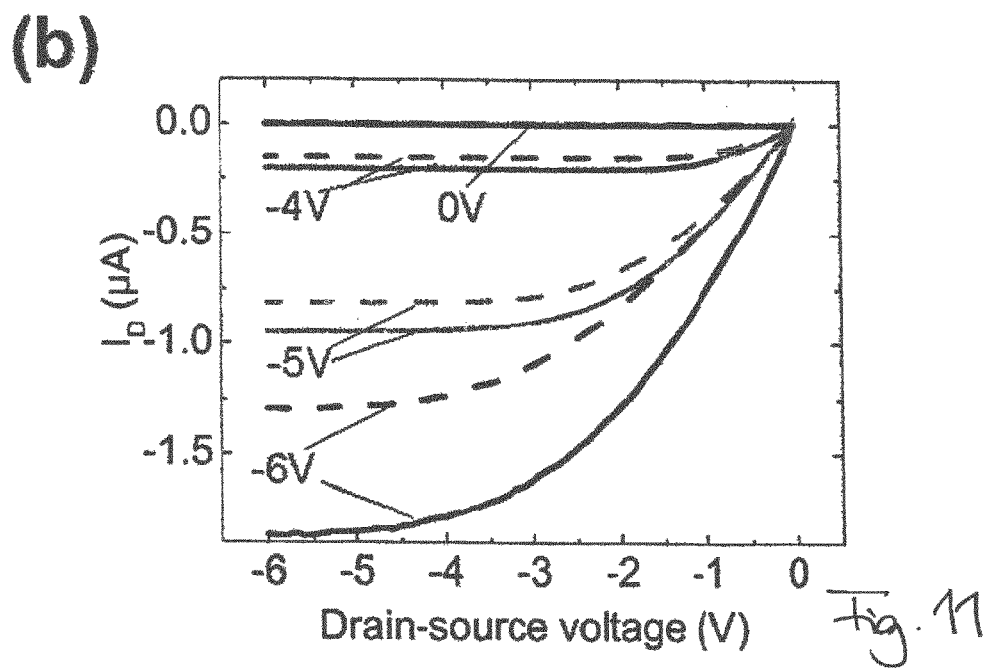
Figure 12:
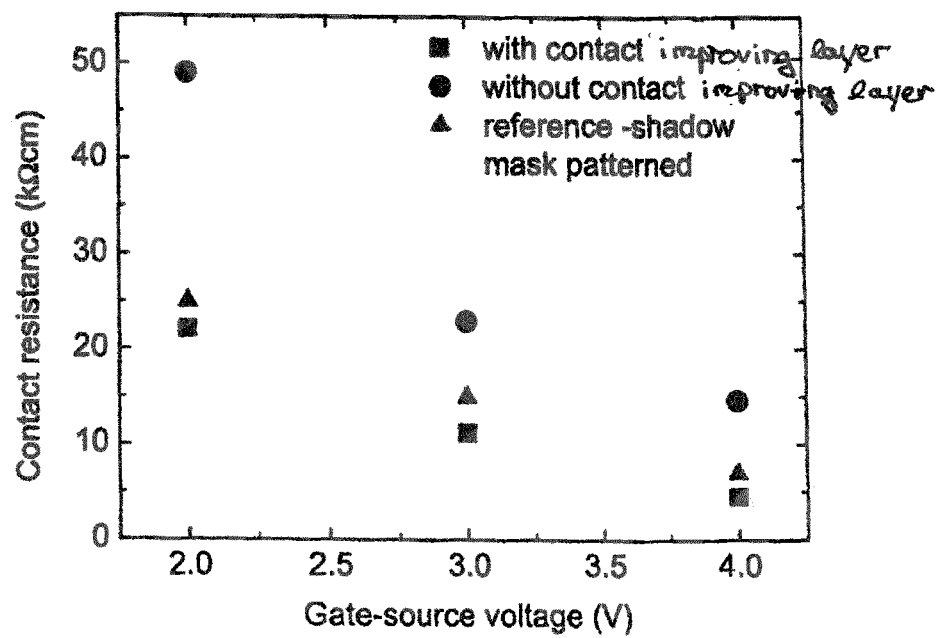

In the following, embodiments will be described in further detail, by way of example, with reference to figures. The figures show:

FIGS. 1a to 1d a schematic representation of a process for producing a layered structure of an organic semiconducting device using a photo-lithographic process, FIG. 2 optical microscope images of layered structures comprising an organic semi-conducting layer, FIG. 3 graphical representations for the transfer characteristic and current-voltage curves (inset) of a lithographically structured OTFT in comparison to a reference device, FIG. 4 graphical representation of a transistor resistance $R_{Ch+2C}$ (channel+contact) of lithographically produced OTFTs for different channel lengths ($V_{DS}=2V$), FIGS. 5a and 5b graphical representations of XPS measurements of the C 1s signal of a $C_{60}$ film after removing Ortho 310 in comparison to a $C_{60}$ film as evaporated (FIG. 5a) and the F 1s signal of a $C_{60}$ film after removing Ortho 310 (FIG. 5b), respectively, FIG. 6 a graphical representation of the luminance of a green OLED for different gate-source voltages at a fixed drain-source voltage of 12V, FIGS. 7a to 7h a schematic representation of a procedure for manufacturing a complementary inverter employing photo-lithography, FIG. 8 a microscope image of an inverter circuit before deposition of electrodes, FIG. 9 a graphical representation of input vs. output voltage (switching characteristics) of the complementary organic inverter fabricated by photo-lithography, FIG. 10 a schematic representation of a process for producing a layered structure of an OTFT by using a photo-lithographic process, FIGS. 11a and 11b a graphical representation of the I-V curves and the transfer characteristics of two lithographically structured OTFTs with and without an contact improving layer, and FIG. 12 a graphical representation of the contact resistance estimated by transmission line method for lithographically made OTFTs with and without the contact improving layer.

Fluorine based photo-lithography is used for high resolution patterning of p- and n-channel organic field effect transistor (OTFT) (pentacene and $C_{60}$) under ambient conditions. The OTFT performance is only slightly affected by the structuring procedure, which can be explained by a detailed study including OTFT characterization and X-ray photoelectron spectroscopy (XPS). Hence, fluorine based photo-lithography exhibits a powerful method for structuring of organic semiconductor materials.

It was found that down-scaling of OTFTs may be restricted by injection of charge carriers from the source electrode. This effect leads to deviations from the gradual channel approximation and therefore from OTFT scaling laws.

For the use of photo-lithography on organic materials it is proposed using sacrificial protection layer(s). These layers may protect the active material from the wet chemicals during the lithographic process and can be either removed or left as a functional part of the device. This concept may be beneficial owing to its versatility and its potential compatibility to a wide class of organic materials. Here, the process of photo-lithography structuring or patterning is applied to small molecule organic semiconductors.

Photo-resists and solvents used for photo-lithographic patterning may be based on highly fluorinated compounds. Such materials are highly hydrophobic and inert concerning reactions with typical organic semiconductors. These properties enable the use of fluorinated photo-resists as protection layers for organic semiconductors. Furthermore, their hydrophobic character warrants the combination with conventional photo-resist compounds using hydrophilic developer solutions.

Following, the use of a photo-lithography process which allows for structuring OTFTs, especially OTFTs containing one or more layers made of $C_{60}$ or pentacene, in a top source/drain geometry under ambient conditions is described. Material properties of the organic semiconductors such as layer adhesion, surface roughness, and sensitivity to oxygen and moisture, may affect the photo-lithography process. In the following, the influence of the patterning procedure on the performance of OTFTs is investigated.

Structuring on organic materials is performed. The structuring process, for example, may be used for fabrication of OTFTs. A highly doped silicon substrate is used as a gate electrode 2 on a substrate 1. The gate electrode 2 is covered by a gate insulator 3 made of $Al_2O_3$. The gate insulator 3, for example, may have a thickness of 23 nm or 50 nm. After substrate cleaning and surface preparation, an organic semiconducting layer 4 of either $C_{60}$ (40 nm) or pentacene (25 nm, 40 nm, and 80 nm) is deposited under vacuum conditions (see FIG. 1a).

Subsequently, the samples are taken out of the vacuum chamber, and are exposed to air the first time. A protection layer 5 made of a lift-off resist (Ortho 310—negative resist, Orthogonal Inc.) is spin-coated (3000 rpm, 30 s, thickness 1 µm) under ambient conditions directly onto the organic semiconducting layer 4 (see FIG. 1b). The lift-off resist Ortho 310 acts as a protective resist since it is based on fluorinated photosensitive polymers which are chemically benign to non-fluorinated organic compounds. It is processed, i.e. deposited, etched, and stripped off, by hydrofluoroether (HFE) solvents.

Worth mentioning, the lift-off resist Ortho 310 only protects the organic semiconductor of the organic semiconducting layer 4 from the wet chemicals, but it is transparent to oxygen. The second role of the protection layer 5 is its use as lift-off resist. This is possible due to the mutual orthogonality of Ortho 310 and non-fluorinated commercial imaging resist. Thus, processing of Ortho 310 does not influence the imaging resist and vice versa.

A photo resist layer 6 made of an imaging resist (ma-P1210, positive resist from micro resist technology GmbH, Berlin, thickness 1 µm) is spin-coated onto the protection layer 5 using the same procedure and it is exposed by the SF-100 UV broadband exposure system (see FIG. 1b). The exposed parts of the photo resist layer 6 are removed by development in NaOH solution for 17 s (see FIG. 1c) and rinsing in deionized water. Afterwards, the photo resist layer 5 serves as an etching mask for Ortho 310. This pattern of the photo resist layer 6 is transferred to Ortho 310 by etching with HFE solvents (see FIG. 1d).

An electrode material 7, namely gold, is deposited through the resist stencil and finally spare gold is removed via lift-off using HFE 7100 in a nitrogen atmosphere (see FIGS. 1e and 1f). Apart from the step in FIG. 1f, all other steps of the structuring process are done under ambient conditions in air. The total exposure time to oxygen and moisture is about 30 min.

In an alternative method, only one of the protection layer 5 and the photo resist layer 6 is used. The only layer deposited will provide photo resist functionality.

Following, the chemical structure of the fluorinated solvent and photo-resist compounds are depicted: (a) HFE 7100, (b) HFE 7300, (c) photosensitive photo-resist (soluble in HFE solvents), and (d) photo-resist after UV light exposure (insoluble in HFE solvents).

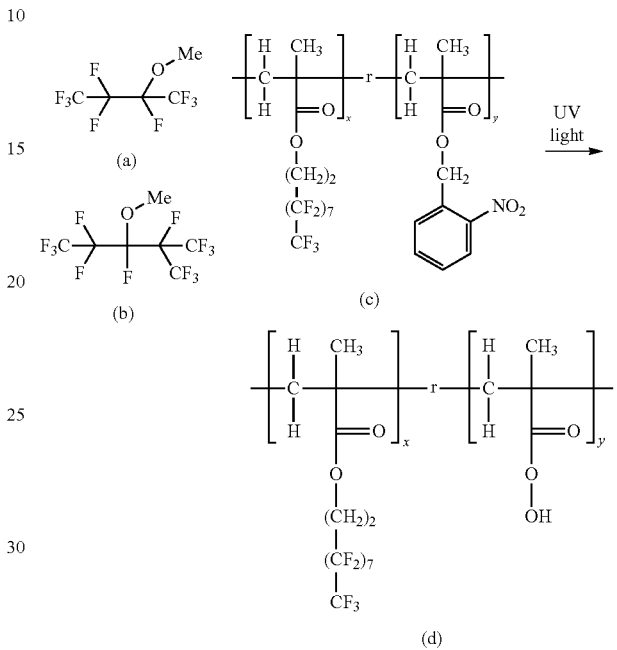

The method may be modified depending on the specific organic material. Since photo-lithography is a multi-step process some conditions may be kept constant in order to identify crucial parameters. In particular, for the described embodiments, resist deposition and development time may remain unchanged. Ideal processing parameters with the highest reliability, independent of layer thickness, are found for $C_{60}$ as:

exposure time 0.6 s (40 mJ/cm$^2$),
development in NaOH for 17 s,
rinsing by deionized water, and
spin-rinsing by HFE 7100 for 50 s (3000 rpm).

These conditions allow for a high resolution patterning on $C_{60}$ without a notable influence on the organic layer. FIGS. 2a to 2d show optical microscope images of layered structures comprising an organic semiconducting layer after a lift-off process as described above. The images show result for a layered structure comprising $C_{60}$ (40 nm) with gold electrodes on top (see FIG. 2a), pentacene (80 nm) with gold electrodes (see FIG. 2b), pentacene (40 nm) with gold electrodes (see FIG. 2c), and pentacene (25 nm) (see FIG. 2d).

For pentacene the patterning process was adapted. In particular, the surface roughness and the weak substrate adhesion of pentacene films may need modifications of the photo-lithography recipe. In FIGS. 2a to 2d pentacene films of various thicknesses (80 nm, 40 nm, and 25 nm) are shown after the lift-off process using the same procedure as established for $C_{60}$. There are differences in layer coverage and optical contrast for the different thicknesses.

Especially, for 80 nm of pentacene (see FIG. 2b), the layer is non-uniform, contains large defects, and looks perforated.

This effect is reduced for 40 nm (see FIG. 2c) of pentacene and even vanishes for 25 nm (see FIG. 2d) where a uniform layer can be observed. The layer roughness of pentacene films may lie in the range of the layer thickness. This property can explain the different optical contrast obtained in the microscope images.

Furthermore, the layer roughness may lead to a different adhesion of photo-resist and organic semiconductor. In particular, since the layer roughness is increased also the effective contact area between photo-resist and pentacene is increased. Hence, if the HFE solvent creeps underneath the photo-resist in order to lift it off, the photo-resist entrains the pentacene film. This is caused by the fact that owing to the large contact area, the adhesion of pentacene to the photo-resist is larger than the adhesion to the substrate. This influence leads to the appearance of defects as obtained in FIG. 2b. If the pentacene layer is thinner, this effect is reduced which also increases the yield of the lift-off process. In general, for the chosen layer thicknesses the lift-off yield increases from <20% for 80 nm of pentacene to >80% for 25 nm thick films. Hence, for a structuring of pentacene films, the layer thickness should be preferably <40 nm.

However, in view of the roughness of pentacene, also other parameters such as resist treatment, exposure time, and/or etching procedure may be modified. The thickness of the photo-resist may be expected to be larger than for $C_{60}$ which is related to the better resist adhesion. Therefore, also larger exposure durations may be required. In detail, for 25 nm thick pentacene films the dose was increased from 0.6 s to 0.75 s-0.8 s to compensate for the larger resist thickness. Such differences of exposure time are undesired if $C_{60}$ and pentacene have to be structured on the same substrate as it is required for e.g. complementary circuits. Therefore, different resist treatment processes are tested. An effective reduction of exposure time is achieved in two different ways. First, the samples can be annealed after resist deposition. Heating at 70° C. for 1 min reduces the exposure time to 0.6 s. Unfortunately, such heating steps may not be applied to some organic materials. A second way to reduce the exposure time is to wait for at least 10 min after resist deposition. The effect of annealing and waiting is similar. In either case, solvents can desorb of the resist which effectively reduces its thickness and therefore the exposure time.

The last step that may be modified for structuring of pentacene is the etching process. In contrast to $C_{60}$ where a spin-rinsing process is employed, etching on pentacene may require a less aggressive procedure owing to the enhanced resist adhesion. Thus, instead of this spin-rinsing, the pentacene samples are dipped into HFE 7300 for 4 min which is less aggressive than HFE 7100. After this dipping, the samples are again dipped in fresh HFE 7300 for 30 s in order to avoid Langmuir-Blodgett film formation on the organic material.

With these modifications of the patterning recipe, pentacene can be structured with a high resolution and a high process yield as known for $C_{60}$.

Following, the influence of photo-lithographic patterning on the OTFT performance is studied.

The buckyball $C_{60}$ molecule is chosen for these investigations since this material can be seen as a benchmark material for electron transporting organic semiconductors. Its high symmetry leads to highest mobility values reported for electron transporting organic semiconductors (cf. Zhang et al., J. Appl. Phys. 104, 104504 (2008), Kobayashi et al., Science and Technology of Advanced Materials 4, 371 (2003), Zhang et al., Appl. Phys. Lett. 93, 133305 (2008)). However, $C_{60}$ has the same tendency as most other electron transporting organic materials: water and oxygen can be adsorbed easily and can act as trap states for charge carrier transport. To discuss influences of the lithography on OTFT performance, changes in threshold voltage, contact resistance, mobility, and subthreshold-swing in comparison to a reference device structured by shadow mask are discussed.

Electron mobilities up to 5 cm² /(V s) have been reported (cf. Kobayashi et al., Science and Technology of Advanced Materials 4, 371 (2003), Zhang et al., Appl. Phys. Lett. 93, 133305 (2008), Virkar et al., Adv. Mat. 19, 1962 (2009)) for $C_{60}$ using special surface treatments or low work function metals for source and drain electrodes. OTFTs prepared are not optimized for highest charge carrier mobility. Nevertheless, charge mobilities obtained are within the state-of-the-art for $C_{60}$ OTFTs. They can be further improved according (cf. Kobayashi et al., Science and Technology of Advanced Materials 4, 371 (2003), Zhang et al., Appl. Phys. Lett. 93, 133305 (2008), Virkar et al., Adv. Mat. 19, 1962 (2009)).

OTFT performance can be influenced by lithographic structuring in two ways. First, resist and solvent compounds will interact with the organic semiconductor. Second, there is an influence since the samples are exposed for several minutes to air and moisture before they are covered by the photo-resist. In order to distinguish between these two influences, the reference sample and the lithographically processed devices are exposed to air after the first characterization. Afterwards additional annealing steps are performed. In detail, after processing and the first measurement of fresh devices, the samples are exposed to air for one hour without protective resist and are heated afterwards for 1 h in a nitrogen glove box at 100° C.

It is well known that $C_{60}$, which has been exposed to air can be reactivated in an oxygen-free atmosphere (cf. Fujimori et al., Solid State Comm. 89, 437 (1994), Matsushima et al., Appl. Phys. Lett. 91, 103505 (2007)) (nitrogen glove box or vacuum). Additional heating may reduce the required reactivation time. $C_{60}$ contains two dominant trap levels, namely deep one (0.4 eV below the conduction level) and a shallow one (0.2 eV below the conduction level) which is mainly caused by physisorption of oxygen and water. These shallow trap states can be healed by heating under vacuum conditions or inert atmosphere. Accordingly, the post-annealing step should help to remove the residuals of water and oxygen remaining in $C_{60}$. Thus, changes of OTFT parameters (threshold voltage, contact resistance, mobility) that can be reversed by the annealing procedure are likely caused by the accidental influence of water and oxygen and not by the lithography itself.

FIG. 3 shows graphical representations for the transfer characteristic and current-voltage curves (inset) of a lithographically structured OTFT in comparison to a reference device.

The transfer characteristics ($V_{DS}$=8V) of lithographically (dotted line) and shadow mask patterned (closed line) $C_{60}$ OTFTs are shown. The transistors have a channel length of 30 μm and a channel width of 300 μm, respectively. The short dotted curve denotes the performances directly after deposition. The short dashed curve shows the OTFT performance after one hour under ambient conditions (measurement in nitrogen) and the dashed line after an annealing of one hour at 100° C. in a nitrogen glove box. The inset shows the current-voltage characteristics of the lithographically processed device. The gate-source voltages are: 2V, 3V, 4V, 6V, 8 V. The gate insulator is a 50 nm layer of $Al_2O_3$ (ALD processed).

In general, both devices show typical OTFT performance, which means a clear off-state, a linear regime, and a saturation if $V_{DS}$ exceeds $V_{GS}$–$V_{th}$. Nevertheless, there are clear differences between reference OTFTs and lithographically structured OTFTs. Obviously, there is a shift in threshold voltage and a reduced on-state current.

In detail, the threshold voltage is shifted between the fresh reference sample ($V_{th}$=1.4V) and lithographically produced sample ($V_{th}$=2.3V) by 0.9V (values are summarized in Table 1 below).

The threshold voltage of the lithographically produced sample further increases to $V_{th}$=3.8V if the sample is exposed to air for one hour. If the sample is annealed, the threshold voltage decreases again to $V_{th}$=3.4V. Thus, oxygen exposure increases threshold voltage. This effect can be partially compensated by heating. Focusing on the reference sample, a similar tendency of threshold voltage shift can be obtained. After air exposure, a threshold voltage of 3.3V is measured. This threshold is reduced to 2.3V after annealing. The threshold shift presumably arises because of water absorbed at the dielectric interface. These states, acting also a trap states, are not removable by the simple annealing procedure done here. They are caused by strongly bound hydroxyl groups at the insulator material. Utilizing highly hydrophobic gate dielectrics as e.g. polymers might help to reduce this effect. Differences in total values of threshold voltage likely arise from the fact that OTFTs produced by lithography have been exposed to air for a longer time and no annealing has been employed after structuring.

affected (580 mV/dec, 600 mV/dec, 610 mV/dec) in comparison to lithographically generated samples. However, assuming that the threshold shift is the only influence of lithographic structuring, changes in subthreshold-swing cannot be explained consistently. This is caused by the fact that an increased number of interface states would lead to an increased threshold voltage and an increased subthreshold-swing. The subthreshold-swing for the reference devices, however, is constant which implies that $qN_{rr}$ is larger than $C_i$ (this means $N_{IT}$>$10^{12}$cm$^{-2}$) (q—elementary charge, $N_{IT}$—density of interface states (1/(cm$^2$ eV), $C_j$—specific capacitance of the gate insulator).

In case of lithographically prepared OTFTs, the sub-threshold-swing is lowered by annealing which suggests, in contradiction to the reference devices, a reduced number of interface states. As it will be pointed out, this discrepancy can be explained by the fact that lithographic structuring leads to an increase of contact resistance.

Following, studies on the relation of contact resistance and mobility are described.

The on-state current for lithographically made samples is smaller than for the reference sample. Besides mobility, an important parameter which may affect the on-state of the field-effect transistor is the contact resistance ($R_C$). $R_C$ is determined using a transmission line model (cf. Necliudov et al., Solid State Electron. 47, 259 (2003)) for all tested types of devices.

TABLE 1

| | $V_{th}$ | Contact Resistance (kΩcm) | | | Mobility | SS-Swing |
|---|---|---|---|---|---|---|
| | (V) | $V_{GS}$ = 4 V | $V_{GS}$ = 6 V | $V_{GS}$ = 8 V | (cm$^2$/(Vs)) | (mV/dec) |
| Reference | | | | | | |
| fresh | 1.4 ± 0.1 | 8.9 ± 0.8 | 6.8 ± 0.8 | 6.1 ± 0.5 | 0.17 ± 0.02 | 580 ± 20 |
| 1 h air | 3.3 ± 0.1 | 22.3 ± 1.6 | 14.0 ± 1.2 | 11.4 ± 1.1 | 0.14 ± 0.02 | 600 ± 20 |
| 1 h at 100° C. | 2.3 ± 0.1 | 14.4 ± 1.4 | 10.5 ± 1.2 | 8.3 ± 0.7 | 0.15 ± 0.02 | 610 ± 20 |
| Lithography | | | | | | |
| fresh | 2.3 ± 0.1 | 43.7 ± 12.5 | 34.5 ± 8.5 | 30.1 ± 3.4 | 0.13 ± 0.02 | 510 ± 20 |
| 1 h air | 3.8 ± 0.1 | 96.5 ± 11.7 | 46.8 ± 5.6 | 30.7 ± 3.6 | 0.10 ± 0.02 | 280 ± 40 |
| 1 h at 100° C. | 3.4 ± 0.1 | 71.6 ± 6.1 | 38.2 ± 3.8 | 22.7 ± 4.1 | 0.11 ± 0.02 | 250 ± 40 |

With respect to Table 1, the following parameters are depicted: threshold voltage, contact resistance, mobility, and subthreshold-swing (SS-swing) for reference $C_{60}$ OTFTs and the lithographically processed transistors. The mobility and threshold voltage axe determined for long channel devices (channel length 30 μm). Mobility is taken from the slope of the transfer curve at $V_{GS}$=5V. The standard deviations are taken from variations of three OTFTs for each channel length and from fitting using the transmission line method, respectively.

Furthermore, a comparison of the transfer curves and on-state currents suggests that the transfer curve of the lithographically produced sample is merely parallel shifted for $V_{GS}$>5V. Accordingly, mobility determined in this OTFT geometry is only slightly influenced (see Table 1). This fact indicates that the transport properties of $C_{60}$ are only slightly affected and annealing is sufficient to remove oxygen and water related trap states in $C_{60}$. Apart from this, for $V_{GS}$<5V a steeper rise of the transfer curve is observed for lithographically produced samples. This increase in sub-threshold-swing becomes more pronounced for larger threshold voltages (see Table 1).

In contrast, the subthreshold-swing of the reference device (fresh, 1 h air, annealing at 100° C. for 1 h) is slightly FIG. 4 shows a transistor resistance $R_{Ch+2C}$ (channel+contact) of lithographically produced OTFTs for different channel lengths ($V_{DS}$=2V). The curves denote different gate-source voltages: $V_{GS}$=4V (40), $V_{GS}$=6V (41), and $V_{GS}$=8V (42). The contact resistance $R_C$ (inset) is estimated from the intersection at zero channel length.

The contact resistance is evaluated from a channel length variation between 30 μm and 100 μm. The gate-source voltage dependence (inset) of contact resistance indicates a field dependent injection mechanism. Table 1 shows that lithographically prepared samples exhibit a stronger field dependence of contact resistance than the reference. Furthermore, a contact resistance four to five times larger than for the reference devices is obtained for the lithographically patterned OTFTs. Lithographically made OTFTs exhibit a contact resistance above these previously reported values.

For low gate-source voltage, significant differences in contact resistance of lithographically produced samples are obtained for different post-treatment steps. These differences presumably arise because of the threshold voltage shift for the various post-treatment steps. However, for a gate-source voltage of 8V, the contact resistance of lithographically produced OTFTs is almost independent of the post-treatment step. In consequence, since for all post-treatment steps similar values of contact resistance are obtained for $V_{GS}$=8V, it can be deduced that there is almost not effect of air and water related trap states in $C_{60}$ on $R_C$. Accordingly, the increased $R_C$ is a direct consequence of the lithographic patterning.

FIGS. 5a and 5b show graphical representations of XPS measurements of the C 1s signal of a $C_{60}$ after removing Ortho 310 in comparison to a $C_{60}$ film as evaporated (FIG. 5a) and the F 1s signal of a $C_{60}$ film after removing Ortho 310 (FIG. 5b), respectively. The spectra are fitted with multiple peaks, assuming a full with at half maximum (FWHM) in the range of 1.0 to 2.0 eV and a Lorentzian to Gaussian contribution (L/G) between 20 and 40. A Shirley background is subducted in all graphs.

This effect presumably appears because of resist residuals between the semiconductor and the source/drain electrode. This assumption is confirmed by the XPS investigations. In particular, an XPS signal is obtained that can be attributed to fluorine, a main component of photo-resist and solvent used here. Consequently, there are partial solvent/resist residuals on the $C_{60}$ film.

For comparison, FIGS. 5a and 5b also show the carbon related XPS signal for a pristine $C_{60}$ film and a $C_{60}$ film processed by lithography. In detail, the signal of the C is core level of the pristine $C_{60}$ film can be fitted with one main peak at 284.8 eV, which is generally attributed to pure carbon compounds. Moreover, the spectrum contains also several shake peaks generally observed for $C_{60}$. In comparison, the signal of the $C_{60}$ film after removing Ortho 310 has lightly changed. One additional peak at 292.1 eV is observed, which lies in the range of reported $CF_2$ and $CF_3$ bonds and hence it can be attributed to carbon which is directly bound to fluorine. The main peak is broadened indicating that two states are present: one again at 284.8 eV and a second with a small chemical shift of 0.2 eV. This shifted peak can be assigned to carbon atoms in the resist which are not directly bound with fluorine but affected by its strong electronegativity. Due to this fact and presence of fluorine signal, it can be concluded that there is still some resist left after removal. However, the presence of an unaffected C-C signal, attributed to the pristine $C_{60}$, indicates that the thickness of these residuals should be in the range of a few monolayers. Nevertheless, XPS investigations clearly disclose the presence of resist residuals on the $C_{60}$ film. Such residuals cause the increased contact resistance for lithographically made devices as summarized in Table 1. Beside its influence on contact resistance, the effect of resist residuals can be seen in the determined value of mobility which is slightly lower for lithographically made OTFTs than for the reference devices (see Table 1).

The problem of resist residuals is known as such for photo-lithography procedures. Such residuals are typically removed by a descum oxygen plasma etch process. Unfortunately, in the present case such processing cannot be directly applied to organic semiconductors, due to oxidation of $C_{60}$.

In summary, lithographically manufactured OTFTs show an increased threshold voltage shift arises because of water and oxygen related trap states at the dielectric interface. Furthermore, a sufficient healing of $C_{60}$ by vacuum/glovebox annealing can be deduced. This can be seen in an almost unaffected mobility (parallel shifted transfer curve for $V_{GS}$>5V). However, an increased contact resistance caused by resist residuals on $C_{60}$ is obtained. A strong field dependence of contact resistance for lithographically prepared samples likely causes a steeper subthreshold-swing.

With respect to photo-lithographic patterning of organic semiconductors, in the following two applications for organic TFTs are discussed: inverter circuits and OTFTs as drivers in OLED displays.

Lithographically patterned OTFTs were found suitable for both applications. However, some limitations for the usage of OTFTs may apply in such circuits. These limitations which are not specific to lithographically made devices may arise from the low transconductance of organic thin-film transistors. This leads either to considerable power losses in case of display drivers or to low switching frequencies in case of organic inverters. The low transconductance can be seen as a direct consequence of the low charge carrier mobility in organic materials and the limited scalability of OTFTs as discussed in the previous subsection. These performance restrictions are not only relevant for lithographically structured OTFTs having an enlarged contact resistance; it can be shown that an equivalent performance to shadow mask patterned OTFTs may be reached, for example, if a special electrode preparation is employed.

Following, OTFTs for OLED display drivers are considered. A green OLED driven by a lithographically produced OTFT was prepared. The layer stack and the OLED performance as such are described in (cf. He et al., Proc. SPIE 26, 5464 (2004), He et al., Appl. Phys. Lett. 85, 3911 (2004)).

A transistor comprising $C_{60}$ with a channel length of 30µm and a channel width of 24 mm is employed. The ratio between the active area of the OLED and the driving transistor is larger than 4 in this case (including OTFT contact pads). This ratio can be increased for smaller feature sizes since the photolithography technique enables to scale down the OTFT size.

FIG. 6 shows results for an OLED driven by a $C_{60}$ OTFT. Curve 60 shows the current through the OLED for different voltages applied across the OLED. Curve 61 displays the luminance of the OLED driven by the OTFT for different gate-source voltages. The inset shows external quantum efficiency (EQE, open circles) and power efficiency ($P_{eff}$ closed rectangles) for different luminance values.

FIG. 6 depicts the luminance of the green OLED for different gate-source voltages at a fixed drain-source voltage of 12V. The higher drain-source voltage, in contrast to FIG. 1, is required to obtain the saturation regime of the OTFT with the OLED in series. Nevertheless, the highly efficient OLED used here guarantees a minimum of driving voltage: a luminance of 1000 cd/m$^2$ is achieved for voltages less than 4V (voltage drop across the OLED). As shown in FIG. 6, an increase in luminance is obtained for increasing gate-source voltage and 1000 cd/m$^2$ are exceeded at 9V. This clearly shows that even without aggressive scaling of driving OTFTs, sufficient luminance of OLED pixels can be achieved. Unfortunately, a comparison of the power efficiency $P_{eff}$ of OLED driven by the OTFT and the pure OLED (60 lm/W, compare (cf. He et al., Appl. Phys. Lett. 85, 3911 (2004)), exhibits that 55 to 70% (depending on the luminance) of the provided electrical power is consumed by the driver.

Following, a combination of two transistors within an inverter circuit is considered as a second application for organic thin-film transistors.

In this context, the patterning of source and drain electrodes on top of organic materials may be applied for fabrication of unipolar inverters. In particular, in order to design such inverters, photo-lithography can help matching the characteristics of the individual OTFTs which significantly improves the inverter gain. Moreover, as a consequence of the increased inverter gain for matching OTFTs, the integration density of transistors can be increased. These points exhibit a clear and strong advantage in comparison to shadow mask fabrication. However, this is not the only advantage of photo-lithographic patterning of inverters since photo-lithography can also be employed to design complementary inverters. Such complementary circuits are superior to unipolar and pseudo-complementary circuits since they offer a higher gain or the inverters, a higher integration density, and less effort in terms or circuit design.

In FIGS. 7a to 7h, a procedure for manufacturing a complementary inverter employing fluorine based photo-lithography is depicted.

A two-step procedure was used. In a first step, after substrate cleaning and HMDS treatment, on a gate layer 71 (n-Si-substrate 70) and a gate insulator layer 72 an organic semiconducting layer 73 made of a thin layer of pentacene serving as p-channel material is deposited (see FIG. 7a). The organic semiconducting layer 73 is covered by photo-resist layers 74 and 75 and structured by photo-lithography as explained above. After the development of photo-resist, the organic semi-conducting layer 73 is removed from the uncovered areas by e.g. an oxygen plasma etch process (radio-frequency plasma) (see FIG. 7d).

In a second deposition step, a further organic semiconducting layer 76 made of $C_{60}$ is deposited as n-channel material (see FIG. 7e). To remove spare $C_{60}$ the sample is dipped in HFE 7300 in nitrogen atmosphere (see FIG. 7f). In this way, the organic semiconducting layer 73 (pentacene) and the further organic semiconducting layer 76 ($C_{60}$) can be structured on the same substrate with a high spatially resolution. The latter aspect is of particular importance for fabrication of high-frequency devices. To finalize the inverter structure, a second lithography step as described above is employed to pattern source and drain electrodes 77 (see FIGS. 7g, 7h -coating, exposure, and development of Ortho 310and ma-P1210, and gold deposition and lift-off in HFE 7300).

A microscope image of the inverter circuit before deposition of the electrodes is shown in FIG. 8. FIG. 8 shows a microscope image of a photo-resist pattern of two OTFTs on pentacene and C60. The channel length of both devices is 20 µm.

FIG. 9 shows a graphical representation of input vs. output voltage (switching characteristics) of the complementary organic inverter fabricated by fluorine based photo-lithography.

The channel length is 50 µm for the p-channel transistor and 62 µm for the n-channel OTFT, respectively. The right axis shows the gain of the inverter. The n- and p-channel OTFT have the same channel width, however, the channel length is chosen with respect to the individual OTFT performance in order to guarantee a switching of the inverter at $V_{DD}/2$. In detail, the channel length of the pentacene p-channel transistor is 50 µm, while the $C_{60}$ n-channel transistor has a channel length of 62 µm for the inverter shown in FIG. 9. As can be seen in FIG. 9, caused by this adjustment of channel length, the inverter switches at $V_{DD}/2$ showing an inverter gain above 4.

Although this inverter shows a reasonable on/off swing, apparently it does not reach $V_{DD}$ for $V_{in}=0$. This can be attributed to the fact that even if the inverter is balanced, the pentacene transistor is not perfectly in the off-state for $V_{in}=0$ (the threshold voltage is slightly negative). Thus, this yields a static current flow across the p-channel transistor for $V_i=0$ and consequently, $V_{out}$ does not reach $V_{DD}$ for $V_{in}=0$. A further consequence of the asymmetry of threshold voltage is the fact that both transistors are not working perfectly in the linear regime at $V_{in}=V_{DD}/2$ (the resistances of both OTFTs in the linear regime are not perfectly matching). This discrepancy leads also to a static current flow and consequently to a reduced inverter gain. In particular, the inverter gain is inversely proportional to the difference between the resistances of both transistors and minute variations of the inverter balance can cause significant differences in the inverter gain.

Photo-lithographically structured OTFTs as discussed above may be restricted in their performance by the increased contact resistance which is equivalent to an enlarged transfer-length. Such possible restrictions, however, may at least in part be compensated by a special preparation of electrode(s), e.g. source and drain electrodes, namely "molecular interface doping". The same method can analogously be employed, for example, to n-channel OTFTs and other organic electronic devices for which a lift-off structuring process is used.

According to FIGS. 10a to 10c, on a substrate 100 a gate layer 101 and a gate insulator layer 102 are deposited. On the gate insulator layer 102 an organic semiconducting layer 103 made of an organic semiconductor material is deposited. In order to structure e.g. source and drain electrodes of an organic thin-film transistor a lithographic patterning as described e.g. in FIG. 1 is employed. In the present example a bilayer photo-resist structure of Ortho 310 (104) and ma-P 1210 (105) is deposited onto the organic layer 103. According to Table 1, FIG. 4 and FIG. 5 charge carrier injection from the electrode into the organic semiconductor material may be hindered by residuals of photoresist. To improve the injection in the OTFT, a contact improving layer 106 (thickness: 1 nm) of the strong acceptor compound $F_6$-TCNNQ is deposited on the organic semiconducting layer 103 which in turn is at least partially covered with a residual layer made of residual photo resist material left over from a former photolithographic process. In order to avoid a doping effect of the acceptor compound $F_6$-TCNNQ on the channel area provided in the organic semiconducting layer 103, the contact improving layer 106 is patterned by the resist mask (layers 104 and 105) used for deposition for source and drain electrode 107 (see FIGS. 10f and 10g).

FIGS. 11a and 11b show the I-V-curves and the transfer characteristics of two lithographically structured OTFTs with and without interface doping. FIG. 11a shows the transfer characteristics (VDS=−6V), and FIG. 11b shows I-V-curves of two pentacene OTFTs structured by fluorine based photo-lithography (channel length 100 µm, channel width 1 mm, 50 nm $Al_2O_3$ serves as the gate insulator). Closed lines show the performance of the transistor with interface doping and dashed lines without interface doping. The gate source voltage for FIG. 11b are provided within the Figure.

As shown there, the thin contact improving layer (injection layer) significantly improves the transistor performance In particular, the off-state current and the threshold voltage are unaffected which means that no free charge carriers are present in the channel. Hence, the dopant merely influences the interface at source and drain electrode.

This effect of interface doping can be seen in the on-state current of the transistor. More specifically, the on-state current for $V_{GS}>V_{th}$ is strongly increased for doped devices whereas the sub-threshold regime in only weakly affected. Within the subthreshold regime, the OTFT performance is not governed by injection of charge carriers, but dominated by the interface properties in the channel. In contrast, above the threshold-voltage, the OTFT behaviour is restricted by the number of charge carriers injected from the source electrode. Hence, since interface doping can effectively reduce injection barriers for charge carriers, a larger on-state current is measured for doped devices. Furthermore, this experiment on interface doping shows in an unambiguous way that the performance of organic thin-film transistor is restricted by charge carrier injection even for long channel devices. For the devices shown in FIG. 10b (long channel devices L=100 µm), the current-voltage curves suggest an increased charge carrier mobility for doped devices (0.1 cm$^2$/(V$_s$) doped, 0.19 cm$^2$/(V$_s$) doped, measured at V$_{GS}$=V$_{DS}$=-6V). Since the channel region is undoped, this has to be seen as an effect of the increased charge carrier density in devices with an injection layer.

To quantify the improvement of charge carrier injection, the contact resistance is measured using the transmission line method. Results of a lithographically patterned OTFT with and without interface doping and a reference OTFT structured by a shadow mask are shown in FIG. 12 which shows the contact resistance estimated by transmission line method for lithographically made OTFTs with (rectangles) and without interface doping (circles). Furthermore, the contact resistance for shadow mask produced OTFT (same layer thickness, geometry, and substrate, without doping) is shown (triangles). The applied source-drain voltage is −1V.

As can be seen, the contact resistance is effectively lowered if "interface doping" (contact improving layer(s)) is employed. Moreover, doped OTFTs can even beat the reference device produced by shadows mask.

Although there are resist residuals on the pentacene, the dopant can effectively provide charge carriers to the matrix. Since this is may not be expected for a closed layer of photo-resist covering the pentacene, it may be concluded that the thin photo-resist film covers the pentacene only partially and hence dopant molecules are in direct contact to the semiconductor material.

It was shown that the high-mobility small molecule organic materials, for example, pentacene and C60, are compatible to photo-lithographic processing under ambient conditions. This may be accomplished by using, for example, a highly fluorinate photo-resist and solvents which are chemically benign to these materials. A reliable lithography process is established. The process proposed also accounts for the different film properties of the organic materials, in particular for the layer roughness of pentacene films.

Organic thin-film transistors are fabricated using this lithography protocol and their performance is compared to reference devices patterned by shadow masks. In this way, influences arising from the lithography procedure and the accidental effects caused by air exposure can be distinguished. Latter ones affect the threshold voltage of the OTFTs, but not charge carrier transport in general. In this context, thermal annealing may help in recovering the transistor performance, and hence a similar charge carrier mobility is observed for lithographically made OTFTs and reference devices. Nevertheless, resist residuals may increase the contact resistance in lithographically patterned OTFTs. In consequence, down-scaling of such OTFTs does not follow the prediction as formulated within the gradual channel approximation. Most notably, the transistor performance is predominantly governed by the transfer length if the channel length is less than 30 µm. This enlarged transfer length can be directly associated to the large contact resistance.

Lithographically made OTFTs are suitable for applications as e.g. driving transistors in OLED displays or as switches in inverter circuits. In particular, the good scalability of photo-lithography exhibits a considerable advantage in comparison to state-of-the-art structuring techniques as e.g. shadow mask patterning. Interface doping may be used as a method for reducing the contact resistance and improving the performance of lithographically patterned OTFTs.

The features disclosed in this specification, the figures and/or the claims may be material for the realization of the invention in its various embodiments, taken in isolation or in various combinations thereof.

The invention claimed is:

1. A method of manufacturing an organic electronic device having a layered device structure, the method comprising:
   providing an organic semiconducting layer;
   applying a structuring layer to the organic semiconducting layer, the structuring layer having a first region and a second region;
   applying a contact improving layer to the structuring layer by depositing, at least in the first region, at least one of an organic dopant material and an organic dopant-matrix material;
   depositing a layer material on the contact improving layer at least in the first region; and
   removing the structuring layer at least in the second region;
   wherein the layered device structure comprises a plurality of electrodes and an electronically active region in electrical contact with at least one of the plurality of electrodes.

2. The method according to claim 1, further comprising a lift-off structuring process.

3. The method according to claim 1, wherein said applying the structuring layer further comprises a photo lithographic process.

4. The method according to claim 3, wherein the photo lithographic process comprises:
   depositing a photo resist cover on the organic semiconducting layer; and
   structuring the photo resist cover, said structuring comprising illuminating the photo resist cover, and removing the photo resist cover, at least partially, in at least the second region, but not the first region.

5. The method according to claim 4, wherein said depositing the photo resist cover comprises:
   depositing a protection layer on the organic semiconducting layer; and
   depositing a photo resist layer on the protection layer.

6. The method according to claim 4, wherein said structuring of the photo resist cover comprises providing a non-closed residual layer made from non-removed residuals of the photo resist cover in the first region.

7. The method according to claim 3, wherein the photo lithographic process is a fluorine based photo lithographic process.

8. The method according to claim 1, further comprising providing a structured electrode layer of an electrode material.

9. The method according to claim 1, further comprising providing a structured non-electrode layer of a non-electrode material.

10. The method according to claim 1, wherein the contact improving layer has a layer thickness of about 1 nm to about 100 nm.

11. The method according to claim 1, wherein the organic electronic device is an organic field effect transistor, organic circuit assembly, organic light emitting device, or organic photovoltaic device.

* * * * *